(12) United States Patent
Gushiken

(10) Patent No.: US 7,285,729 B2
(45) Date of Patent: Oct. 23, 2007

(54) PRINTED CIRCUIT BOARD

(75) Inventor: Hajime Gushiken, Fussa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 11/311,374

(22) Filed: Dec. 20, 2005

(65) Prior Publication Data

US 2006/0141854 A1 Jun. 29, 2006

(30) Foreign Application Priority Data

Dec. 24, 2004 (JP) ............................. 2004-373903

(51) Int. Cl.
*H05K 1/14* (2006.01)
(52) U.S. Cl. ...................... 174/261; 174/268; 361/789; 361/803
(58) Field of Classification Search ................ 174/261, 174/268; 361/789, 803
See application file for complete search history.

(56) References Cited

U.S. PATENT DOCUMENTS 5,680,183 A * 10/1997 Sasuga et al. ................. 349/58
5,822,030 A * 10/1998 Uchiyama .................... 349/149
5,838,412 A * 11/1998 Ueda et al. .................. 349/150
7,196,275 B2 * 3/2007 Babb et al. .................. 174/382
2004/0132491 A1 * 7/2004 Kim et al. ................ 455/556.1
2004/0200889 A1 * 10/2004 Ho et al. .................. 228/248.1
2004/0218367 A1 * 11/2004 Lin et al. ..................... 361/721
2005/0136703 A1 * 6/2005 Van Schuylenbergh et al. ............................ 439/67
2005/0243472 A1 * 11/2005 Kamigama et al. ....... 360/265.7
2006/0086772 A1 * 4/2006 Ho et al. ..................... 228/101

FOREIGN PATENT DOCUMENTS

| JP | 07-135383 | 5/1995 |
| JP | 07-162120 | 6/1995 |

\* cited by examiner

*Primary Examiner*—Gary Paumen
(74) *Attorney, Agent, or Firm*—Pillsbury Winthrop Shaw Pittman, LLP

(57) ABSTRACT

A printed circuit board includes circuit lines having different transmission characteristics. In the printed circuit board, mounted components are connected to each other at a plurality of points by an anisotropic conductive film (ACF) adhesion by using a flexible circuit board (FPC) which includes transmission lines formed of circuit line patterns having transmission characteristics optimal to signals. This structure enables the printed circuit board to be easily designed, and be also made smaller.

8 Claims, 4 Drawing Sheets

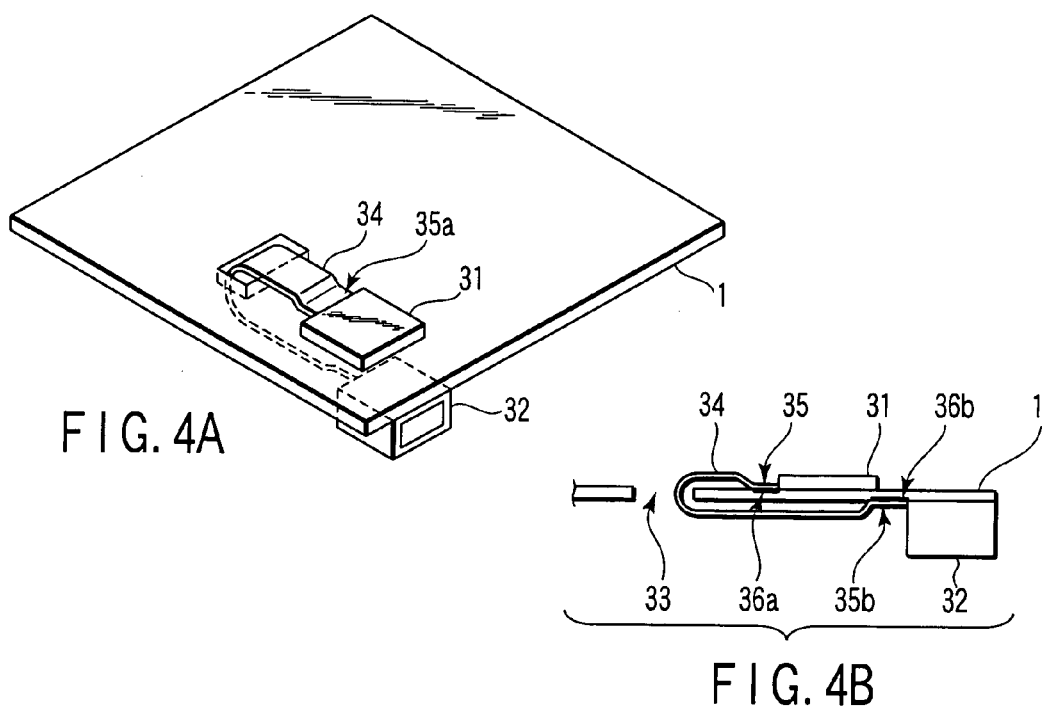
FIG. 4A
FIG. 4B
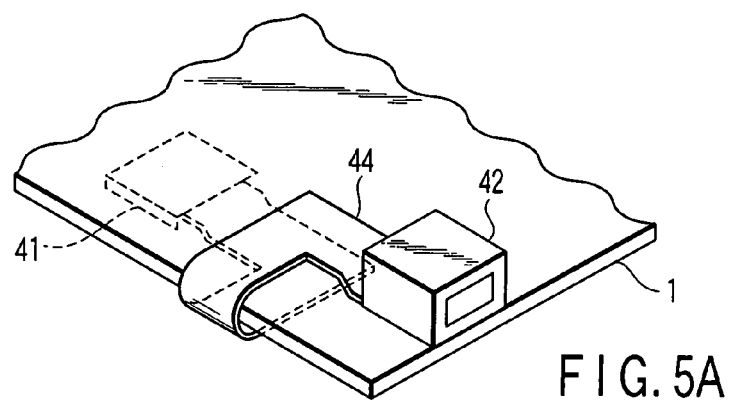
FIG. 5A
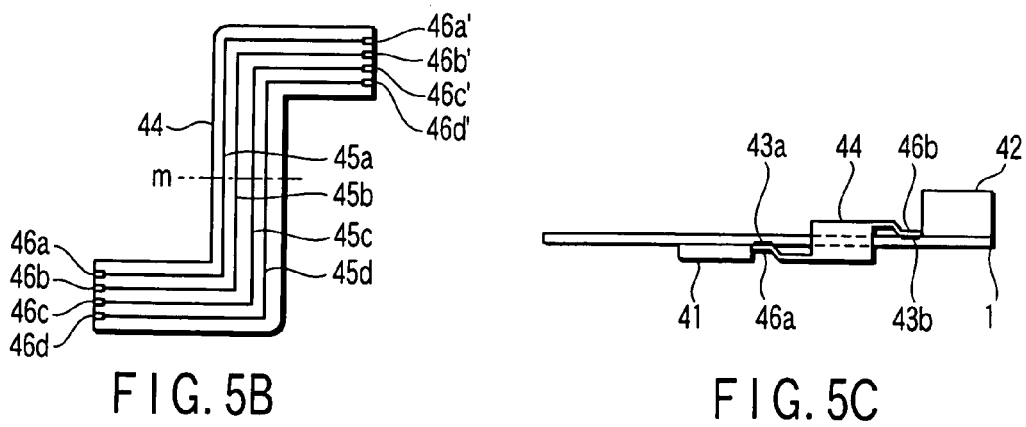
FIG. 5B
FIG. 5C

PRINTED CIRCUIT BOARD

CROSS-REFERENCE TO RELATED APPLICATIONS

This application is based upon and claims the benefit of priority from prior Japanese Patent Application No. 2004-373903, filed Dec. 24, 2004, the entire contents of which are incorporated herein by reference.

BACKGROUND

1. Field

The present invention relates to a printed circuit board (PCB) to which a flexible cable including transmission lines having different characteristics is connected at a number of points by using an anisotropic conductive film (ACF).

2. Description of the Related Art

In general, electronic equipment incorporates a printed circuit board (PCB) formed of rigid resin, on which various components are mounted, and circuit lines electrically connecting the components are formed. Also, a notebook computer incorporates various circuit boards including a PCB such as a motherboard. Those circuit boards are electrically connected to each other by a flexible circuit board (which will be hereinafter referred to an FPC wherein circuit lines are provided in a resin sheet), etc.

Furthermore, as disclosed in Jpn. Pat. Appln. KOKAI Publication No. 7-162120, one end of each of two rectangular FPCs is fixed to a rectangular PCB having upper and lower surfaces on which circuit line patterns are formed, respectively, such that the longitudinal directions of the rectangular FPCs are perpendicular to each other. In each of the upper and lower surfaces of each of the FPCs, a number of circuit patterns are formed to extend in the longitudinal direction of each FPC. On the other end sides of the rectangular FPCs, parts of circuit patterns which electrically connect the FPCs are exposed. After the FPCs are bent, the other end sides of the FPCs are made to overlap each other, and then they are adhered to each other by an anisotropic conductive adhesive, so that the exposed parts of the circuit patterns are electrically connected to each other.

According to Jpn. Pat. Appln. KOKAI Publication No. 7-162120, predetermined circuits of the circuit patterns formed on the upper and lower surface sides of the PCB can be electrically connected to each other without provision of through holes or jumper wires.

In recent years, the speed of information processing or operation speed has been increased. As a result, there is a case where in a single PCB, circuit lines having different impedances are formed for a single signal line, which can be shared by a plurality of signals since the timings of transmission of the signals are made to differ from each other. In particular, it should be noted that specific high-speed transmission lines are provided, which differ from ordinary transmission lines for use in information processing, which comply with IEEE 1394 or USB 2.0.

Further, if, e.g., a graphic signal, is transmitted through such a high-speed transmission line as stated above, it is necessary to form at least 16 lanes, i.e., 64 signal lines. Furthermore, in a USB, since a plurality of connectors are provided, circuit lines extending to the connectors are formed. In a PCB, since various components are mounted thereon, circuit lines tend to be located to extend between the components or be located on an outer peripheral area of a surface of the PCB. Therefore, the larger the number of high-speed transmission lines provided on the PCB to improve the function of the PCB, the larger the area for provision of the high-speed transmission lines, thus increasing the size of the PCB. In order to avoid such a problem, a PCB or an FPC is formed to have a multi-layer wiring structure. However, there is a case where the multi-layer wiring structure is limited with respect to the number of times a signal is transmitted through a through hole or holes when being transmitted between layers. Whether it is limited or not depends on a signal to be transmitted. For example, in a PCI Express bus, it is preferable that the number of times a signal is transmitted through the through hole or holes be only one.

A technique disclosed in Jpn. Pat. Appln. KOKAI Publication No. 7-162120 includes a manufacturing step in which in space, ends of FPCs are positioned relative to each other, and are then fixed to each other. Thus, this manufacturing step cannot be easily carried out. To be more specific, in the technique disclosed in the KOKAI Publication, after two EPCs are prepared, and ends of the FPCs are fixed to a PCB such that they are made to overlap each other to intersect each other at right angles, the other ends of the FPCs are adhered to each other in such a way as to intersect each other at right angles. That is, in a step, the one ends of the FPCs must be accurately fixed to the PCB, so that in another step, the other ends of the FPCs can be made to intersect each other at right angles. Even if one of the FPCs is slightly inclined, they cannot be located to intersect each other at right angles, and contacts cannot be located to face each other when the other ends of the FPCs are put together, that is, they cannot be electrically connected to each other. However, the above other ends of the FPCs can be forcibly adhered to each other, while being made to intersect each other at right angles, since the FPCs have flexibility. However, in this case, since they are adhered against their reactive forces, there is a risk that the adhered parts may be separated by secular changes, etc., and as a result electrical disconnection may occur.

Moreover, in Jpn. Pat. Appln. KOKAI Publication No. 7-162120, FPCs are required to be positioned with a higher precision as the number of circuit lines is increased, and the pitch of the circuit lines is decreased. However, the FPCs cannot be easily connected to each other in space with a high precision. In addition, widths of circuit lines serving as high-speed transmission lines are determined based on their impedances, etc. That is, they cannot be freely increased, even if they need to be done in order that the above positioning be easily performed.

BRIEF SUMMARY

The present invention provides a printed circuit board to which a flexible cable is connected at a number of points, the flexible cable including a plurality of circuit lines including high-speed transmission lines which have optimal signal transmission characteristics for desired signals, respectively.

BRIEF DESCRIPTION OF THE SEVERAL VIEWS OF THE DRAWING

FIGS. 4A and 4B are views showing an example of the structure of a printed circuit board according to a third embodiment of the present invention.

FIGS. 5A, 5B and 5C are views showing an example of the structure of a printed circuit board according to a fourth embodiment of the present invention.

DETAILED DESCRIPTION

Embodiments of the present invention will be explained with reference to the accompanying drawings.

Figure 1A:
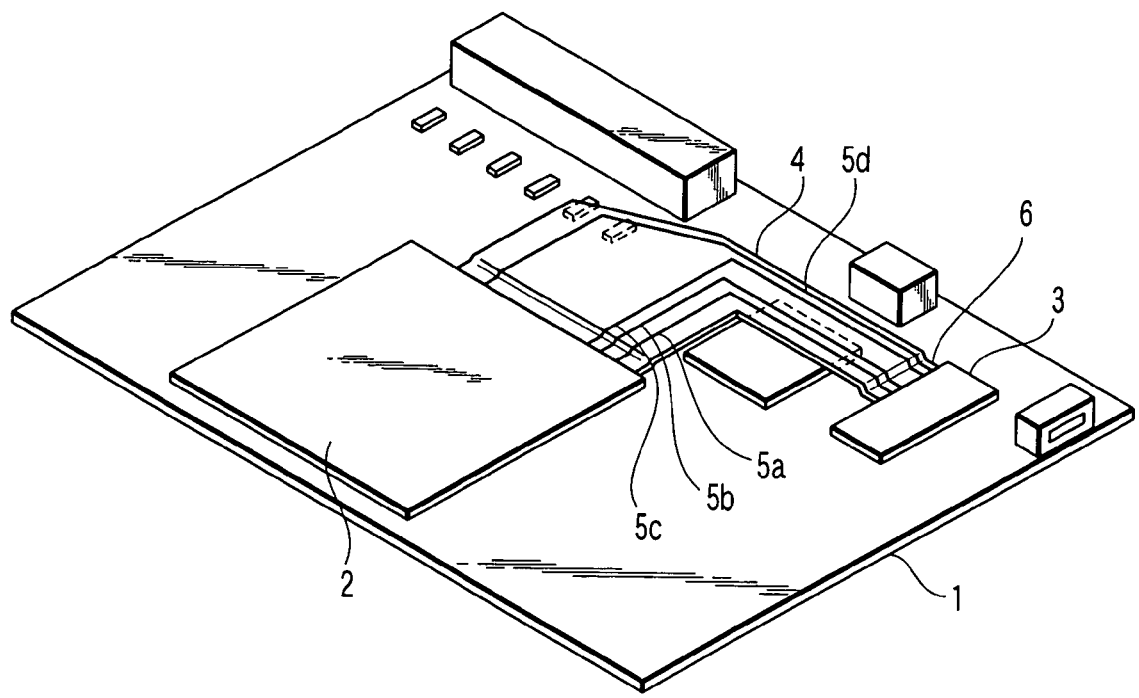
FIGS. 1A and 1B are views showing an example of the structure of a printed circuit board according to a first embodiment of the present invention.
Figure 1B:
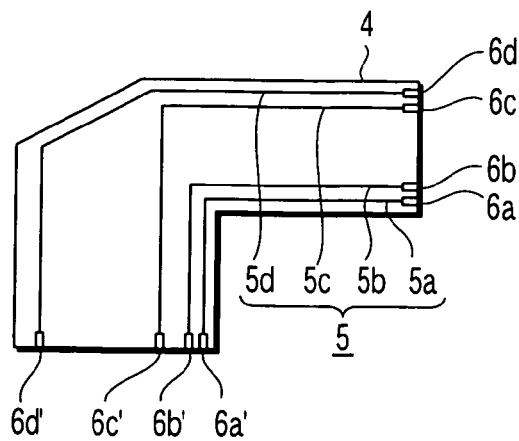
Figure 2:
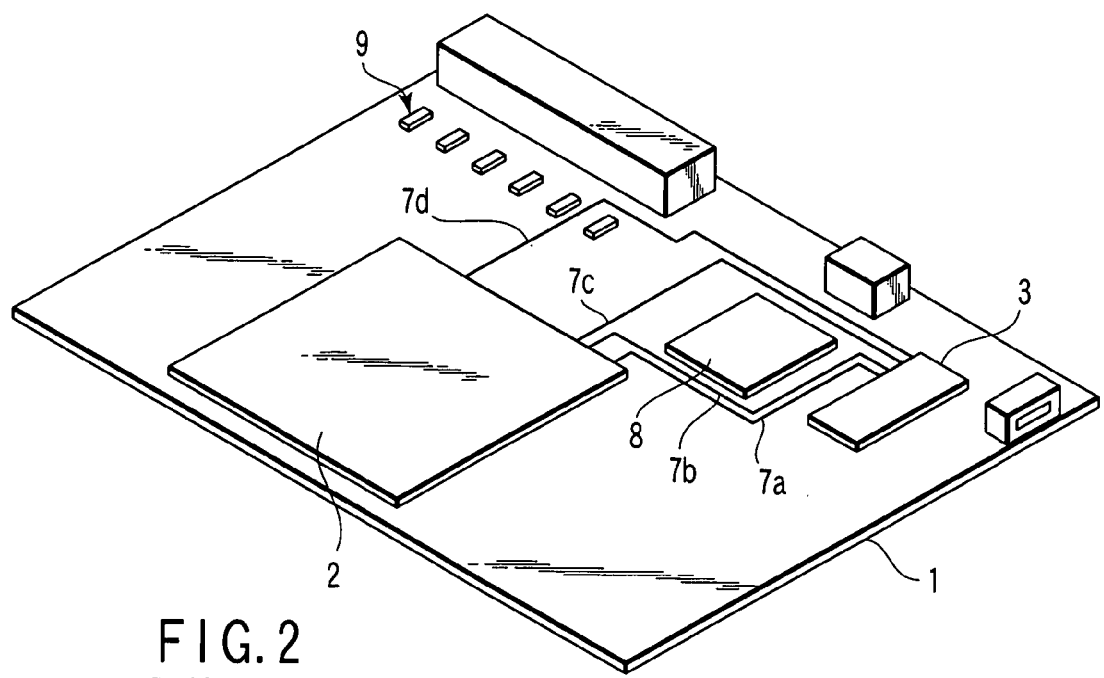
FIG. 2 is a view showing an example of the structure of a conventional printed circuit board to be compared with the printed circuit board according to the first embodiment.

FIGS. 1A and 1B show an example of the structure of a printed circuit board according to a first embodiment of the present invention. FIG. 2 shows an example of the structure of a conventional printed circuit board to be compared with the printed circuit board according to the first embodiment.

On a printed circuit board (PCB) 1, a number of components including integrated circuit (IC) elements 2 and 3 are mounted, and are electrically connected to circuit lines formed on the PCB 1. It should be noted that in general, various types of PCBs are known. For example, in a PCB, circuit lines (wiring layer) are formed only on the upper surface (or the upper and lower surfaces) of the PCB. In a multi-layer PCB, a number of wiring layers are formed hierarchically. However, with respect to the first embodiment, the following explanation will be given by referring to, by way of example, a PCB in which wiring layers are formed on the upper and lower surfaces of the PCB, in order that the explanation be simplified. Furthermore, with respect to the first embodiment, suppose through holes are used in connection between the wiring layers on the upper and lower surfaces of the PCB.

Before explaining the present invention, the wiring structure of the conventional PCB shown in FIG. 2 will be explained. In the wiring structure of the conventional PCB, in order that an IC 2 and an IC 3 be connected to each other by specific transmission lines different in characteristics from an ordinary transmission line (an analog signal transmission line or a digital signal transmission line), since various components are mounted on the PCB 1, it is necessary that the transmission lines are located so as not to contact various components mounted on the PCB (i.e., circuit lines 7a to 7d are provided as the transmission lines in areas other than areas where the above components are mounted).

In such a manner, in the conventional PCB, the transmission lines having different characteristics are provided in number of areas between the components as shown in FIG. 2. Alternatively, if the transmission lines influence each other due to their transmission characteristics, they cannot be provided close to each other or in parallel with each other, and are thus provided in different areas such that they are not provided close to each other or in parallel with each other. In the conventional printed circuit board, referring to FIG. 2, the circuit lines 7a and 7b are located on the right side of a component 8, the wiring line 7c is located on the left side of the structural member 8, and the wiring line 7d is located leftward of the wiring line 7c with respect to the component 8, and also extends between components 9. However, in such a manner, if a large number of circuit lines are arranged on a PCB as in the conventional PCB, it is very difficult to design the PCB.

On the other hand, the wiring structure in the first embodiment, as shown in FIGS. 1A and 1B, uses a flexible circuit board (which will be hereinafter referred to as an FPC) 4 where circuit lines (transmission lines) electrically connecting an IC 2 and an IC 3 are formed. The FPC 4 is L-shaped and formed of a sheet which has a thickness of approximately 12 to 18 μm, and which is formed of insulateive material such as polyimide or liquid crystal polymer. However, the shape of the FPC 4 is not limited to the L-shape. It suffices that it is properly designed in shape in accordance with which ones of the components mounted on a PCB should be connected to each other and how components are mounted thereon.

On the above sheet, circuit lines 5a to 5d are formed. In formation of the circuit lines 5a to 5d, their positions, their widths and the distances between them are adjusted such that they have desired transmission characteristics. The circuit lines 5a to 5d are formed by a general manufacturing method. For example, it suffices that a metal film is formed of copper or the like on the sheet by vapor deposition or plating processing or the like, and after being covered with a mask, it is wet-etched such that circuit lines are formed to extend along desired paths and have desired widths. Alternatively, they may be formed by a film formation technique such as sputtering or CVD, or dry etching may be applied instead of the above wet etching. Furthermore, in the case where the FPC is bent as in the other embodiments which will be described later, the circuit lines need not be linearly formed, i.e., they may be bent as long as they function as transmission lines having transmission characteristics.

In the vicinity of the IC 2 and the IC 3 mounted on the PCB 1, electrodes (not shown) are formed which are electrically connected to input and output terminals of the IC 2 and IC 3, respectively. Also, in the FPC 4, at the time of forming the circuit lines 5a to 5d, input and output electrodes (terminal portions) 6a to 6d and 6a' to 6d' are formed in positions coincident with those of the input and output terminals formed on the PCB 1 and at the ends of the circuit lines 5a to 5d.

Next, the FPC 4 is fixedly adhered to the PCB 4. To be more specific, they are put together such that the input and output electrodes (terminal portions) 6a to 6d and 6a' to 6d' of the FPC 4 are made to face the electrodes connected to the input and output terminals formed on the PCB 1. At this time, they are adhered to each other, with an anisotropic conductive film (ACF) interposed between the above input and output electrodes and the above electrodes. This ACF adhesion is a well-known technique, and an ACF adhesive to be applied to the ACF adhesion is a film-shaped adhesive in which metal-coated plastic or metal particles are distributed. In the case where the above input and output electrodes are adhered to the above electrodes in the above manner, the conductive particles of the metal-coated plastic or the metal particles function to cause electric conduction to be effected between the input and output electrodes and the electrodes.

Due to the above ACF adhesion, the circuit lines of the FPC 4 can function as conductive lines, as a result of which a signal can be electrically transmitted between the IC 2 and IC 3.

In such a manner, in the first embodiment, circuit lines can be formed specific to signals to be applied, such that their signal transmission characteristics are optimal. Thus, it suffices that in the FPC, some desired signal lines are formed, that is, not all the signal lines respectively having all signal transmission characteristics need to be formed on the PCB. Accordingly, the PCB can be easily designed. Further, since the electrodes of the PCB and those of the FPC are directly connected to each other by the ACF adhesion, it is not necessary to provide connectors, thus reducing the cost of components and the area for mounting components on the PCB. Thus, the PCB can be made smaller. Furthermore, since the PCB and the FPC, as stated above, are fixedly adhered to each other, it is not necessary to consider contact resistances which would generate if the electrodes of the PCB and those of the FPC were connected by connectors, or a problem which would arise due to detachment of the connectors from the PCB. The above adhesion of the PCB and the FPC is easily achieved, compared with the case where EPCs are precisely adhered to each other in space.

Next, an example of the structure of a printed circuit board according to the second embodiment of the present invention will be explained.

Figure 3:
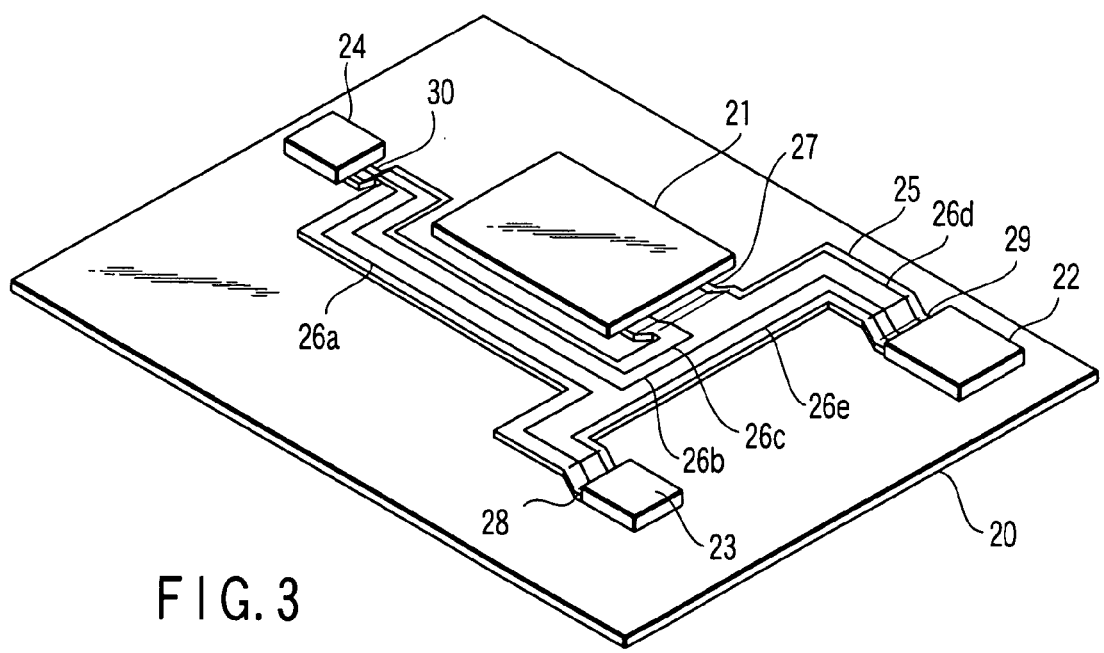
FIG. 3 is a view showing an example of the structure of a printed circuit board according to a second embodiment of the present invention.

In the example of the structure in the second embodiment shown in FIG. 3, a plurality of components are connected with a single FPC. The second embodiment can be effectively applied to the case where the number of signals, which are to be transmitted, and which have different transmission characteristics, is large, whereas the number of signal lines which are shared by the signals is small. In the example shown in FIG. 3, at least four ICs, i.e., ICs 21, 22, 23 and 24, are mounted on the PCB 20.

As shown in FIG. 3, in an FPC 25, circuit lines 26*a* to 26*e* are formed to extend to respective desired connection portions. In the example shown in FIG. 3, four FPC electrode terminals 27, 28, 29 and 30 are provided. Also, electrodes (not shown) connected to input and output terminals of ICs 21, 22, 23 and 24 are provided close to these ICs. The FPC electrode terminals 27, 28, 29 and 30 are connected to the above electrodes connected to the input and output terminals of the ICs by the ACF adhesion.

By virtue of the above structure, according to the second embodiment, the same advantage can be obtained as in the first embodiment. Further, in the second embodiment, a PCB can be more easily designed, since a number of components can be connected to each other by a single FPC. Also, a PCB which is required to permit transmission of a group of signals having different characteristics can be easily designed.

Next, an example of the structure of a printed circuit board according to the third embodiment of the present invention will be explained.

In the example of the structure in the third embodiment shown in FIGS. 4A and 4B, components mounted on the upper and lower surfaces of the PCB are connected to each other. This structure is suitable for transmission lines which are limited in the number of times a signal is transmitted through a through hole or holes when being transmitted between the components mounted on the upper and lower surfaces of the PCB, as in the above-mentioned Express bus.

In the third embodiment, components, e.g., an IC 31 for USB and a USB connector 32, which are mounted on the upper and lower surfaces of the PCB 1, respectively, are connected to each other. In this case, a slit 33 penetrating the PCB 1 is provided therein, and an FPC 34 is provided to extend through the slit 33, and connect the IC 31 and the USB connector 32.

In the FPC 34, desired circuit lines are formed; and electrodes 35*a* and 35*b* are provided at both ends of the circuit lines, as in the FPC 4. The electrodes 35*a* and 35*b* are connected by the ACF adhesion to electrodes 36*a* and 36*b* connected to the input and output terminals of the IC 31 and the USB connector 32.

By virtue of the above structure, the same advantage can be obtained as in the first and second embodiment. Furthermore, a PCB, which is limited with respect to arrangement of signal lines and the number of through holes in a transmission line, can be also easily designed.

Next, an example of the structure of a printed circuit board according to a fourth embodiment of the present invention will be explained.

In the third embodiment, the FPC extends through the slit to connect the components on the upper and lower surfaces of the PCB. On the other hand, in the fourth embodiment, an FPC is provided to extend along an outer peripheral end portion of the PCB to connect components on the upper and lower surfaces the PCB.

To be more specific, in the example shown in FIGS. 5A, 5B and 5C, components, e.g., an IC 41 for USB and a USB connector 42, are mounted on the upper and lower surfaces of the PCB 1, respectively, and electrodes 43*a* and 43*b* connected to input and output terminals of the IC 41 and the USB connector 42 are provided close to the IC 41 and the USB connector 42.

Furthermore, as shown in FIG. 5C, a crank-shaped FPC 44 is provided to connect the IC 41 and the USB connector 42, and desired circuit lines 45*a* to 45*d* are formed as wiring, and electrodes 46*a* to 46*d* and 46*a*' to 46*d*' are formed at both ends of the circuit lines 45*a* to 45*d*, as in the above FPC 4. The FPC 44, as shown in FIG. 5B, is bent at a position "m", and is put close to the outer peripheral end portion of the PCB 1, and the electrodes 46*a* and 46*b* are connected to the electrodes 43*a* and 43*b* connected to the IC 41 and the USB connector 42 by the ACF adhesion. It is preferable that part of the FPC 44 which is to be put close to the outer peripheral end portion of the PCB 1 should not contact the outer peripheral end portion. Further, in the above example, the FPC 44 is crank-shaped since the components are arranged as shown in the drawings. However, there is a case where the FPC 44 is linearly formed, and is then bent to be U-shaped, in accordance with arrangement of the components, which differs from that in the above example. In such a manner, it suffices that the FPC 44 is properly designed in accordance with arrangement of the components.

By virtue of the above structure, the same advantage can be obtained as in the first to third embodiments. Furthermore, in the case where the number of through holes is limited in order to obtain desired transmission characteristics, arrangement of the components can be easily designed. In addition, since no slit is provided, the PCB 1 has no part where causes a break in the circuit lines.

Figure 6:
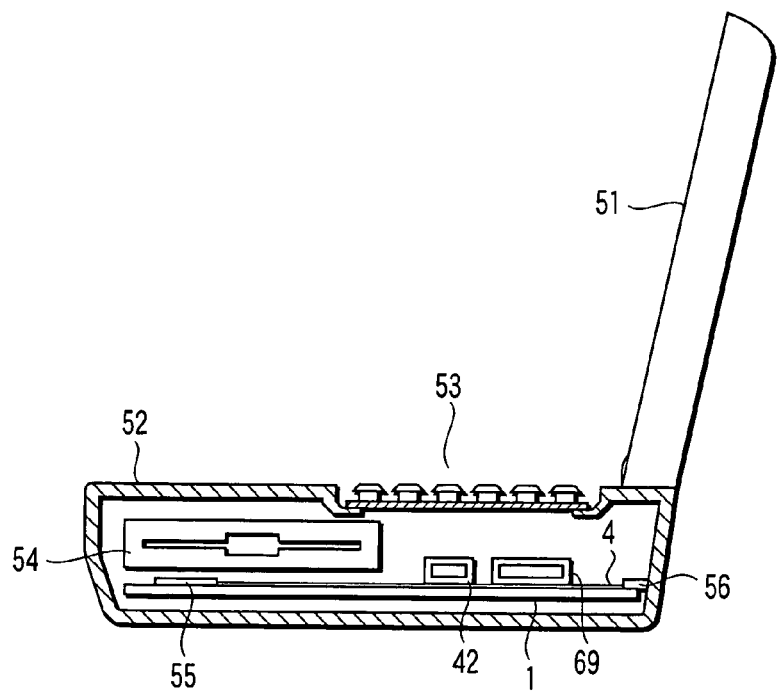
FIG. 6 is a view showing a vertical section of a notebook computer incorporating a printed circuit board according to a fifth embodiment of the present invention.
Figure 7:
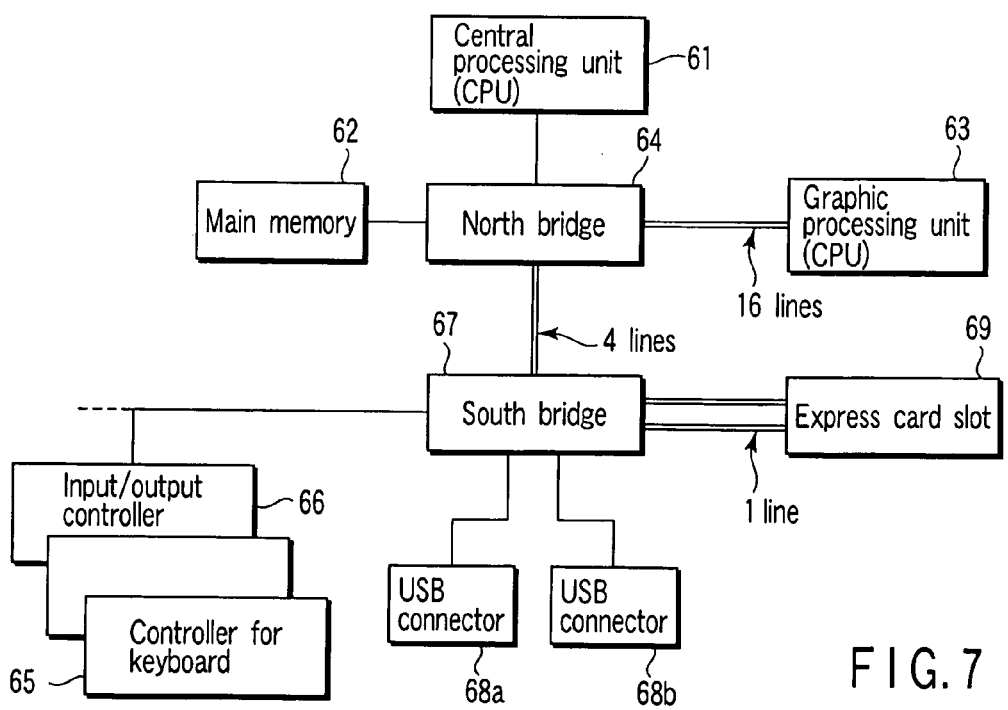
FIG. 7 is a block diagram showing a relationship in connection between structural members in a printed circuit board in a notebook computer, according to a fifth embodiment of the present invention.

Next, as a fifth embodiment of the present invention, a notebook computer which is an example of an electronic device incorporating the PCB of the present invention will be explained. FIG. 6 is a view showing a vertical section of a notebook computer incorporating a PCB. FIG. 7 is a block diagram showing a relationship in connection between components in the PCB in the notebook computer.

The notebook computer, as shown in FIG. 6, mainly comprises a display section 51 incorporating a liquid crystal display panel and a device body 52 to which the display section 51 is rotatably attached. In the device body 52, a keyboard 53 is provided as input means on an upper surface of the device body 52, an input/output unit 54, a USB connector 42 and an Express card slot 69 which will be described later, etc., are provided at a side surface of the device unit 52. The input/output unit 54 permits an external record medium such as a floppy (trademark) disk or a CD to be loaded in the input/output unit 54. The FPC 4 provided at the PCB 1 located in the device body 52 is connected to, e.g., an IC 55 for USB and a USB connector 56.

As shown in FIG. 7 which shows an example of a basic configuration (chip set) of the notebook computer, it comprises a central processing unit (CPU) 61, a north bridge 64 which controls a main memory 62 and a graphic processing unit (GPU) 63, and a south bridge 67 which controls a controller 65 for keyboard, and an input/output controller 66.

In the south bridge 67, USB connectors 68a and 68b for connection to another input/output device are provided, and the Express card slot 69 for insertion of an Express card is also provided. In the above structure, four lines are connected between the north bridge 64 and the south bridge 67, sixteen lines are connected between the north bridge 64 and the graphic processing unit 63, one line is connected between the south bridge 67 and the Express card slot 69, by respective buses which comply with PCI Express. Furthermore, connection between the south bridge 67 and the Express card slot 69, that between the south bridge 67 and the USB connector 68a, and that between the south bridge 67 and the USB connector 68a and 68b are achieved by respective buses which comply with USB 2.0.

The PCB of the present invention is applied to the case where the above buses complying with PCI Express and USB 2.0 are mixed together. The PCB can be easily designed, since it suffices that some desired circuit lines are formed in the FPC, that is, not all the signal lines having all signal transmission characteristics are formed on the PCB. In particular, it should be noted that circuit lines can be formed specific to signals to be applied, such that their signal transmission characteristics are optimal.

With respect to the above embodiments, the above explanation of connection of the FPC to the PCB at a number of points (multi-point connection) is given by referring to the case where wiring layers are formed on the upper and lower surfaces of the printed circuit board. Needless to say, application of the above multi-point connection between the FPC and the PCB is not limited to the above case. That is, it can also be applied to a PCB having a multi-layer wiring structure. For example, suppose in a PCB having four wiring layers, the first to fourth wiring layers are provided in this order from the lower surface side of the PCB to the upper surface side thereof, and the case where the present invention is applied to the second and third wiring layers will be explained In the above case, the FPC is provided on the upper surface side (the fourth layer), and electrodes for connection are formed at associated circuit lines of the second and third wiring layer. The PCB is shaved to expose the second and third wiring layers from its upper surface side. The electrodes of the signal lines formed in the FPC are connected to the electrodes of the exposed second and third layers by the ACF adhesion. Needless to say, this technique can be applied to the same layer in the multi-layer wiring structure. For example, in order that connection between circuit lines of the second layer be achieved, parts of the circuit lines which are to be connected are exposed to the first layer side, and are then connected to each other by the FPC. By virtue of such a feature, the present invention can be applied to a plurality of wiring layers in a multi-layer structure.

The present invention can provide a printed circuit board to which a flexible cable is connected at a number of points, the flexible cable including a plurality of circuit lines including high-speed transmission lines which have optimal signal transmission characteristics for desired signals, respectively.

What is claimed is:

1. A printed circuit board comprising:
   a board;
   a plurality of components mounted on the board;
   transmission lines which have different transmission characteristics, which are located between associated components included in the plurality of components to electrically connect the associated components, and which permit various kinds of signals to be transmitted through the transmission lines; and
   a flexible cable in which transmission lines are formed for those signals of the various kinds of signals which drive desired components included in the associated components, and cause two or more of the desired components to be electrically connected to each other by an anisotropic conductive film adhesion.

2. The printed circuit board according to claim 1, wherein the flexible cable includes a plurality of circuit lines, and connects terminals or electrodes of components mounted on a surface of the printed circuit board.

3. The printed circuit board according to claim 1, wherein the flexible cable includes a plurality of circuit lines, and connects terminals or electrodes of components mounted on upper and lower surfaces of the printed circuit board.

4. The printed circuit board according to claim 1, which has a multi-layer structure, and wherein connection portions of wiring layers in the multi-layer structure, which are to be connected to each other, are exposed, and are electrically connected to the flexible cable by the anisotropic conductive film adhesion.

5. An electronic device comprising:
   a main body;
   a board provided in the main body;
   a plurality of components mounted on the board;
   transmission lines which have different transmission characteristics, which are located between associated components included in the plurality of components to electrically connect the associated components, and which permit various kinds of signals to be transmitted through the transmission lines; and
   a flexible cable in which transmission lines are formed for those signals of the various kinds of signals which drive desired components included in the associated components, and cause two or more of the desired components to be electrically connected to each other by an anisotropic conductive film adhesion.

6. The electronic device according to claim 5, wherein the flexible cable includes a plurality of circuit lines, and connects terminals or electrodes of components mounted on a surface of the printed circuit board.

7. The electronic device according to claim 5, wherein the flexible cable includes a plurality of circuit lines, and connects terminals or electrodes of components mounted on upper and lower surfaces of the printed circuit board.

8. The electronic device according to claim 5, which includes a multi-layer structure, and wherein wiring layers in the multi-layer structure, which are to be connected to each other, are exposed, and are electrically connected to the flexible cable by the anisotropic conductive film adhesion.

* * * * *